US011384431B2

(12) United States Patent
Nakayama et al.

(10) Patent No.: US 11,384,431 B2
(45) Date of Patent: Jul. 12, 2022

(54) SUBSTRATE PROCESSING APPARATUS (71) Applicant: HITACHI KOKUSAI ELECTRIC INC., Tokyo (JP)

(72) Inventors: Masanori Nakayama, Toyama (JP); Takeshi Yasui, Toyama (JP); Masaki Murobayashi, Toyama (JP); Teruo Yoshino, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 678 days.

(21) Appl. No.: 15/697,818

(22) Filed: Sep. 7, 2017

(65) Prior Publication Data

US 2018/0076063 A1 Mar. 15, 2018

(30) Foreign Application Priority Data

Sep. 13, 2016 (JP) .............................. JP2016-178547

(51) Int. Cl.
  *C23C 16/455* (2006.01)
  *H01J 37/32* (2006.01)
  (Continued)

(52) U.S. Cl.
  CPC ...... *C23C 16/45542* (2013.01); *C23C 16/505* (2013.01); *H01J 37/321* (2013.01); *H01J 37/32091* (2013.01); *H01L 21/68742* (2013.01)

(58) Field of Classification Search
  CPC ........... H01L 21/67161; H01L 21/6719; H01L 21/0228; H01L 21/3065; H01L 21/67109;
  (Continued)

(56) References Cited

U.S. PATENT DOCUMENTS 5,434,353 A * 7/1995 Kraus .................... H01J 37/321
                                                        174/11 OR
5,710,486 A * 1/1998 Ye ..................... H01J 37/32082
                                                        315/111.21
(Continued)

FOREIGN PATENT DOCUMENTS

JP          9283300 A      10/1997
JP      2002-237486 A       8/2002
(Continued)

OTHER PUBLICATIONS

Espacenet English machine translation of JP2015015272A (Year: 2015).*

(Continued)

*Primary Examiner* — Benjamin Kendall
*Assistant Examiner* — Kurt Sweely
(74) *Attorney, Agent, or Firm* — Volpe Koenig (57) ABSTRACT A substrate processing apparatus includes: a first process chamber where a substrate is subjected to a first process; a second process chamber where the substrate is subjected to a second process; a substrate support unit; a first electrode; a second electrode; an elevating unit; a gas supply unit supplying a first gas, a second gas and a third gas to the substrate; a power supply unit; a control unit controlling the elevating unit, the gas supply unit and the power supply unit so as to: (a) perform the first process by supplying the second gas activated by the first electrode and the first gas to the substrate; (b) move the substrate on the substrate support unit from the first process chamber to the second process chamber after (a); and (c) perform the second process by supplying the third gas activated by the second electrode to the substrate after (b).

18 Claims, 6 Drawing Sheets (51) Int. Cl.
*H01L 21/687* (2006.01)
*C23C 16/505* (2006.01)

(58) Field of Classification Search
CPC ......... H01L 21/67115; H01L 21/67376; H01L 21/67393; H01L 21/68742; H01J 37/32091; H01J 37/3266; H01J 37/32495; H01J 37/32568; H01J 37/32669; H01J 37/32082; H01J 37/321–32119; H01J 37/32513; H01J 37/32522; H01J 2237/334; H01J 37/3211; H01J 37/32366; H01J 37/32385; H01J 37/32431; H01J 37/32532; H01J 37/32559; H01J 37/3255; C23C 14/228; C23C 14/351; C23C 16/4583; C23C 16/505; C23C 16/50; C23C 16/503; C23C 16/509; C23C 16/517; C23C 16/4409; C23C 16/45544; C23C 16/4585; C23C 16/481–483; C23C 16/56; C23C 16/45542

See application file for complete search history.

(56) References Cited

U.S. PATENT DOCUMENTS

| | | | | |
|---|---|---|---|---|
| 5,948,215 | A * | 9/1999 | Lantsman | H01J 37/3405 |
| | | | | 204/192.12 |
| 6,082,293 | A | 7/2000 | Kawashima | |
| 7,085,616 | B2 * | 8/2006 | Chin | C23C 16/45525 |
| | | | | 118/719 |
| 7,829,469 | B2 * | 11/2010 | Chen | H01J 37/32091 |
| | | | | 156/345.44 |
| 9,064,695 | B1 * | 6/2015 | Hirochi | C23C 16/405 |
| 2004/0050329 | A1 | 3/2004 | Ikeda | |
| 2005/0241762 | A1 * | 11/2005 | Paterson | H01J 37/321 |
| | | | | 156/345.28 |
| 2006/0105114 | A1 | 5/2006 | White | |
| 2007/0102119 | A1 | 5/2007 | Ikeda | |
| 2008/0135518 | A1 * | 6/2008 | Chen | H01J 37/32091 |
| | | | | 216/67 |
| 2008/0282982 | A1 * | 11/2008 | White | C23C 16/509 |
| | | | | 118/723 R |
| 2010/0190348 | A1 | 7/2010 | Akae et al. | |
| 2010/0243620 | A1 * | 9/2010 | Yamawaku | H01J 37/32623 |
| | | | | 219/121.54 |
| 2011/0240222 | A1 | 10/2011 | Sawada et al. | |
| 2014/0102638 | A1 * | 4/2014 | Ooya | H01J 37/32091 |
| | | | | 156/345.28 |
| 2015/0093913 | A1 | 4/2015 | Toyoda et al. | |

FOREIGN PATENT DOCUMENTS

| | | | |
|---|---|---|---|
| JP | 2008-521218 | A | 6/2008 |
| JP | 2010-123689 | A | 6/2010 |
| JP | 2010-183069 | A | 8/2010 |
| JP | 2012-193457 | A | 10/2012 |
| JP | 2013-219198 | A | 10/2013 |
| JP | 2015015272 | A * | 1/2015 |
| JP | 2015-092533 | A | 5/2015 |
| KR | 20080080704 | A | 9/2008 |

OTHER PUBLICATIONS

English machine translation of JP-2015015272-A (Taira) (Year: 2015).*
Chinese Office Action dated Nov. 28, 2018 for the Chinese Patent Application No. 201710780303.3.
Japanese Office Action dated Sep. 12, 2018 for Japanese Patent Application No. 2016-178547.
Korean Office Action dated Sep. 13, 2018 for the Korean Patent Application No. 10-2017-0108703.
Taiwanese Office Action dated Oct. 29, 2018 for the Taiwanese Patent Application No. 106130550.

* cited by examiner

SUBSTRATE PROCESSING APPARATUS

CROSS-REFERENCE TO RELATED PATENT APPLICATION

This U.S. non-provisional patent application claims priority under 35 U.S.C. § 119 of Japanese Patent Application No. 2016-178547, filed on Sep. 13, 2016, in the Japanese Patent Office, the entire contents of which are hereby incorporated by reference.

BACKGROUND

1. Field

The present disclosure relates to a substrate processing apparatus.

2. Description of the Related Art

Due to high integration density of semiconductor devices such as large scale integrated circuits (LSIs), dynamic random access memories (DRAMs) and flash memories, the miniaturization of circuit pattern or the structure formed in the manufacturing process of the semiconductor device is in progress. In order to realize the miniaturization in the manufacturing process of the semiconductor device, processes using plasma are performed. Additional processes using plasma may be performed to modify the characteristics of a film.

It is necessary to improve the characteristics of the substrate after the processes using plasma for modifying the characteristics of the film are performed.

SUMMARY

Described herein is a technique capable of improving the characteristics of the substrate after the processes using plasma for modifying the characteristics of the film are performed.

According to one aspect of the technique described herein, a substrate processing apparatus may include: a first process chamber where a substrate is subjected to a first process; a second process chamber where the substrate is subjected to a second process, the second process chamber being spatially in communication with the first process chamber; a substrate support unit configured to support the substrate; a first electrode provided in the first process chamber to face the substrate support unit; a second electrode provided at a side wall of the second process chamber; an elevating unit configured to move the substrate support unit between the first process chamber and the second process chamber; a gas supply unit configured to supply a first gas, a second gas and a third gas to the substrate; a power supply unit configured to apply electric power to the first electrode and the second electrode; a control unit configured to control the elevating unit, the gas supply unit and the power supply unit so as to: (a) perform the first process by supplying the second gas activated by the first electrode and the first gas to the substrate; (b) move the substrate placed on the substrate support unit from the first process chamber to the second process chamber after (a); and (c) perform the second process by supplying the third gas activated by the second electrode to the substrate after (b).

DETAILED DESCRIPTION

Embodiments will be described below.

Embodiment

An embodiment will be described with reference to the drawings.

(1) Configuration of Substrate Processing Apparatus

First, a substrate processing apparatus according to the embodiment will be described.

Figure 1:
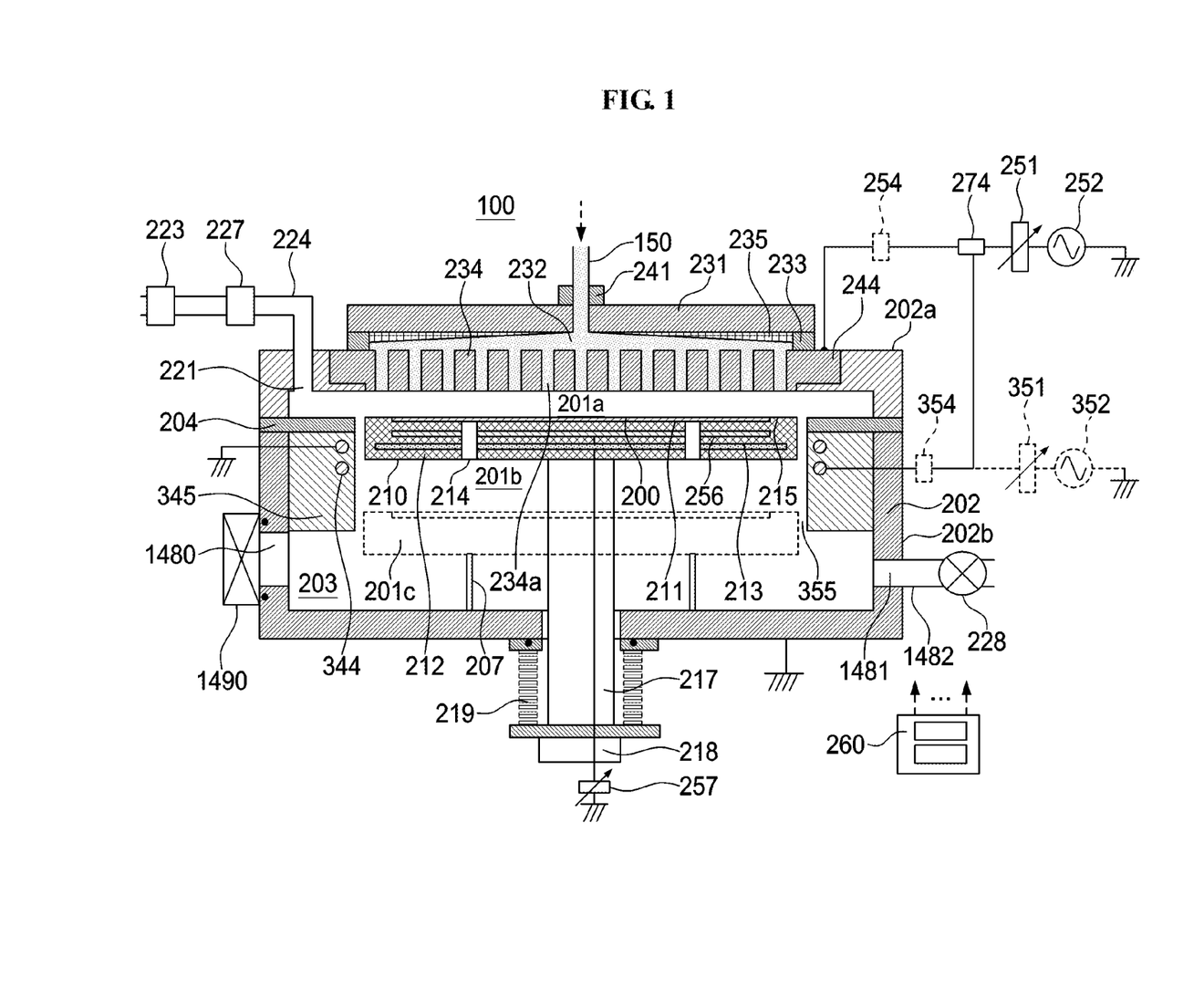
FIG. 1 schematically illustrates a configuration of a substrate processing apparatus according to an embodiment described herein.

A substrate processing apparatus 100 according to the embodiment will be described. The substrate processing apparatus 100 may include an insulating film forming unit. As shown in FIG. 1, the substrate processing apparatus 100 includes, for example, a single wafer substrate processing apparatus.

As shown in FIG. 1, the substrate processing apparatus 100 includes a process vessel 202. For example, the process vessel 202 is a flat and sealed vessel having a circular horizontal cross-section. The process vessel 202 is made of a metal material such as aluminum (Al) and stainless steel (SUS) or quartz. A first process space (a first process chamber) 201*a* where a wafer 200 such as a silicon wafer is processed, a second process space (a second process chamber) 201*b* and a transfer space (transfer chamber) 203 are provided in the process vessel 202. The process vessel 202 includes an upper vessel 202*a* and a lower vessel 202*b*. A partition plate 204 is provided between the upper vessel 202*a* and the lower vessel 202*b*. A space above the partition plate 204 surrounded by the upper vessel 202*a* is referred to as the first process chamber 201*a*. A space between the partition plate 204 and a second exhaust port 1481 for exhausting the lower vessel 202*b* is referred to as the second process chamber 201*b*. Preferably, the second process chamber 201*b* is a space provided when the substrate support unit 210 is in the second process position 201*c* and is located below the partition plate 204 and above the substrate placing surface 211. A space adjacent to a gate valve 1490 surrounded by the lower vessel 202*b* is referred to as the transfer chamber 203.

A substrate loading/unloading port 1480 is provided on a side surface of the lower vessel 202*b* adjacent to the gate valve 1490. The wafer 200 is moved between a substrate transfer chamber (not shown) and the transfer chamber 203 through the substrate loading/unloading port 1480. Lift pins 207 are provided at the bottom of the lower vessel 202*b*. The lower vessel 202*b* is electrically grounded.

A substrate support unit 210 is provided in the process vessel 202 to support the wafer 200. The substrate support unit 210 includes a substrate support 212 having a substrate placing surface 211 on which the wafer 200 is placed and a heater 213 serving as a heating unit. Holes 214 wherethrough the lift pins 207 penetrate are provided in the substrate support 212 at positions corresponding to the lift pins 207. A bias electrode 256 for applying a bias to the wafer 200, the first process chamber 201a and the second process chamber 201b may be provided in the substrate support 212. The bias electrode 256 is electrically connected to a bias control unit 257. The bias control unit 257 is configured to adjust the bias.

The substrate support 212 is supported by a shaft 217. The shaft 217 penetrates the bottom of the process vessel 202 and is connected to an elevating unit 218 at the outside of the process vessel 202. The wafer 200 placed on the substrate placing surface 211 may be elevated and lowered by elevating and lowering the shaft 217 and the substrate support 212 by the elevating unit 218. A bellows 219 covers the lower portion of the shaft 217 to maintain the first process chamber 201a and the second process chamber 201b airtight.

When the wafer 200 is transported, the substrate support 212 is lowered until a wafer transfer position denoted by the dashed line in FIG. 1 is reached. When the wafer 200 is subjected to a first process, the substrate support 212 is elevated until a first process position (wafer processing position) shown FIG. 1 is reached. When the wafer 200 is subjected to a second process, the substrate support 212 is moved until a second process position 201c denoted by the dashed line in FIG. 1 is reached. When the substrate support 212 is at the wafer transfer position, the upper ends of the lift pins 207 protrude from the substrate placing surface 211.

Specifically, when the substrate support 212 is lowered to the wafer transfer position, the upper ends of the lift pins 207 protrude from the substrate placing surface 211, and the lift pins 207 supports the wafer 200 from thereunder. When the substrate support 212 is elevated to the wafer processing position, the lift pins 207 are retracted from the substrate placing surface 211 and the substrate placing surface 211 supports the wafer 200 from thereunder. Preferably, the lift pins 207 are made of a material such as quartz and alumina since the lift pins 207 are in direct contact with the wafer 200.

<Exhaust System>

A first exhaust port 221, which is a first exhaust unit for exhausting an inner atmosphere of the first process chamber 201a and the second process chamber 201b, is connected to the inner surface of the first process chamber 201a (the ceiling of the upper vessel 202a). An exhaust pipe 224 is connected to the exhaust port 221. A pressure controller 227 such as an APC (Automatic Pressure Controller) and a vacuum pump 223 that control the inner pressure of the first process chamber 201a and the second process chamber 201b are connected in-line to the exhaust pipe 224 in order. A first exhaust system (a first exhaust line) includes the exhaust port 221, the exhaust pipe 224 and the pressure controller 227. The first exhaust system may further include the vacuum pump 223. The second exhaust port 1481 for exhausting an inner atmosphere of the transfer chamber 203 is connected to the surface of the inner wall of the transfer chamber 203. An exhaust pipe 1482 is connected to the second exhaust port 1481. A pressure controller 228 is connected to the exhaust pipe 1482. The inner atmosphere of the transfer chamber 203 may be exhausted to a predetermined pressure through the exhaust pipe 1482 by the pressure controller 228. The inner atmosphere of the first process chamber 201a and the second process chamber 201b may also be exhausted through the transfer chamber 203.

<Gas Introduction Port>

A shower head 234 is provided at the upper portion of the first process chamber 201a. A gas introduction port 241 for supplying various gases into the first process chamber 201a and the second process chamber 201b is provided at the ceiling of the shower head 234. A detailed configuration of each gas supply unit connected to the gas introduction port 241 will be described later.

<Gas Dispersion Unit)

The showerhead 234, which is a gas dispersion unit, includes a buffer chamber 232 and a first electrode 244 which is part of a first activation unit. The first electrode 244 has holes 234a for dispersing and supplying a gas to the wafer 200. The shower head 234 is provided between the gas introduction port 241 and the first process chamber 201a. A gas supplied through the gas introduction port 241 is supplied to the buffer chamber 232 of the shower head 234 and is then supplied to the first process chamber 201a and the second process chamber 201b via the holes 234a.

The first electrode 243 is made of a conductive metal. The first electrode 243 is part of an activation unit (excitation unit) for exciting the gas. An electromagnetic wave (high frequency wave or microwave) may be applied to the first electrode 243. When a cover 231 is made of a conductive material, an insulating block 233 is provided between the cover 231 and the first electrode 243. The insulating block 233 electrically insulates the cover 231 from the first electrode 243.

A gas guide 235 may be installed in the buffer chamber 232. The gas guide 235 has a conical shape having the gas introduction port 241 as a center with a diameter increasing toward the outer periphery of the wafer 200. The lower end of the gas guide 235 extends further outward than the end of the region where the holes 234a are provided. By installing the gas guide 235, the gas may be uniformly supplied to the holes 234a, and the active species may be supplied to the entire surface of the wafer 200 in uniform manner.

<First Activation Unit (First Plasma Generating Unit)>

A matching unit 251 and a high frequency power supply 252 are connected to the first electrode 243 which is part of the first activation unit via a switch 274. The matching unit 251 and the high frequency power supply 252 may supply an electromagnetic wave (high frequency wave or microwave) to the first electrode 243. When the electromagnetic wave is supplied to the first electrode 243, the gas supplied into the first process chamber 201a may be activated. The first electrode 244 is configured to generate capacitively coupled plasma. Specifically, the first electrode 244 is a conductive plate and configured to be supported by the upper vessel 202a. The first activation unit may include at least the first electrode 244, the matching unit 251 and the high frequency power supply unit 252. The first activation unit may further include an impedance meter 254. The impedance meter 254 may be provided between the first electrode 244 and the high frequency power supply 252. The matching unit 251 and the high frequency power supply 252 may be feedback-controlled based on the measured impedance by the impedance meter 254.

<Second Activation Unit (Second Plasma Generating Unit)>

The matching unit 251 and the high frequency power supply 252 are connected to a second electrode 344 which is part of a second activation unit via the switch 274. The matching unit 251 and the high frequency power supply 252 may supply an electromagnetic wave (high frequency wave or microwave) to the second electrode 344. When the electromagnetic wave is supplied to the second electrode 344, the gas supplied into the second process chamber 201*b* may be activated. The second electrode 344 is configured to generate inductively coupled plasma. By generating inductively coupled plasma, active species may be generated in large quantities in the second process chamber 201*b*. Specifically, the second electrode 344 includes a coil wound around the second process chamber 201*b*. The second electrode 344 is surrounded by a quartz member 345. Thus, the second electrode 344 is not in direct contact with the gas. The quartz member 345 also serves as a guide for the gas supplied to the second process chamber 201*b* through the gas introduction port 241 such that the gas is uniformly supplied to the wafer 200 provided in the second process chamber 201*b*. When the substrate support unit 210 is in the second process position 201*c* such that the lower end of the quartz member 345 is located lower than the upper end 215 of the substrate support 212, a gas exhaust channel 355 is formed around the substrate support 212 through which the gas may is uniformly exhausted around the periphery of the wafer 200. Instead of the switch 274, a matching unit 351 and a high frequency power supply 352 may be provided. The matching unit 351 and the high frequency power supply 352 are configured to supply a high frequency power to the second electrode 344.

<Gas Supply System>

The gas supply pipe 150 is connected to the gas introduction port 241. A first gas, a second gas, a third gas, a fourth gas and a purge gas, which are described later, are supplied through the gas supply pipe 150.

Figure 2:
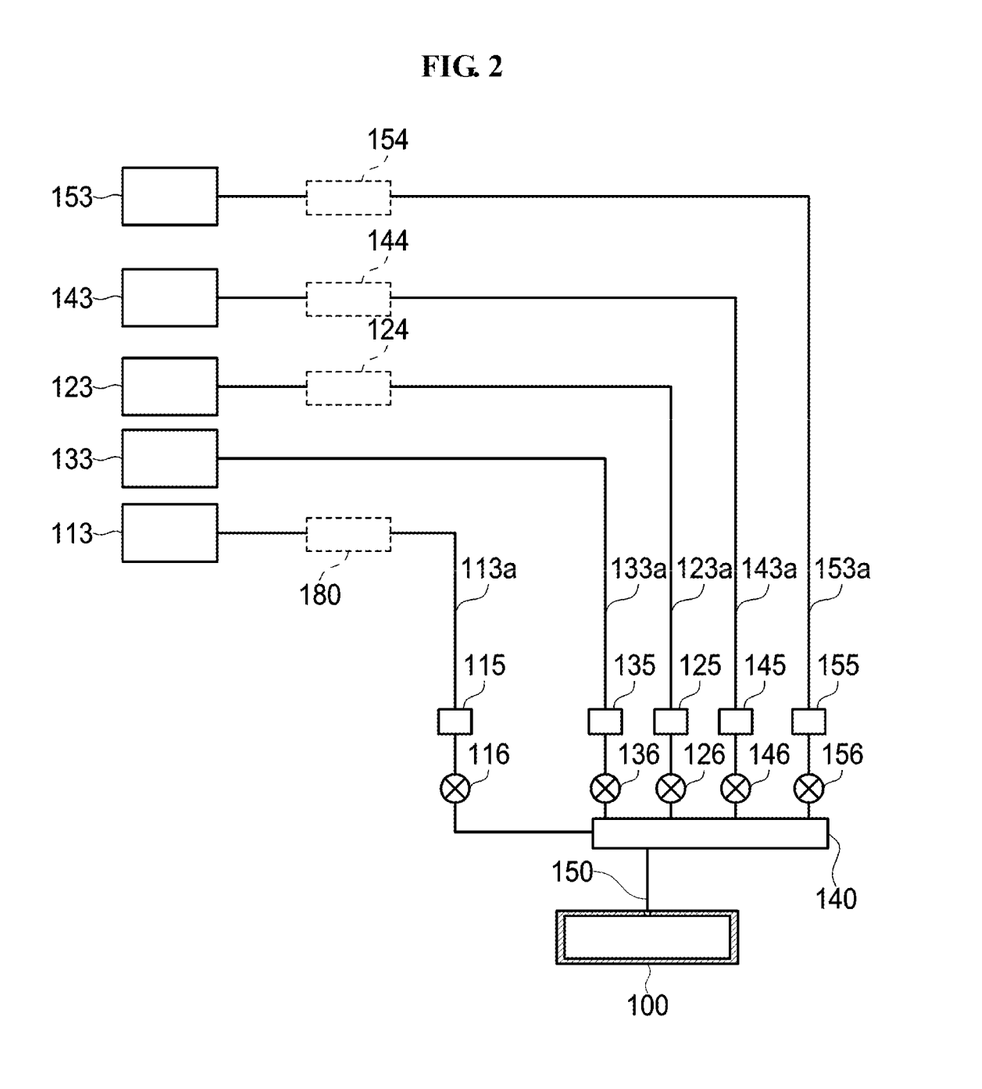
FIG. 2 schematically illustrates a configuration of a gas supply system of the substrate processing apparatus according to the embodiment.

FIG. 2 schematically illustrates the configurations of the gas supply system including as a first gas supply unit, a second gas supply unit, a third gas supply unit, a fourth gas supply unit and a purge gas supply unit.

As shown in FIG. 2, a gas supply pipe aggregation unit 140 is connected to the gas supply pipe 150. A first gas (process gas) supply pipe 113*a*, a purge gas supply pipe 133*a*, a second gas (process gas) supply pipe 123*a*, a third gas (treatment gas) supply pipe 143*a* and a fourth gas (additive gas) supply pipe 153*a* are connected to the gas supply pipe aggregation unit 140.

<First Gas Supply Unit>

The first gas supply unit includes the first gas supply pipe 113*a*, a mass flow controller (MFC) 115 and a valve 116. The first gas supply unit may further include a first gas supply source 113 connected to the first gas supply pipe 113*a*. When the source of the process gas is liquid or solid, the first gas supply unit may further include an evaporator 180.

<Second Gas Supply Unit>

The second gas supply unit includes the second gas supply pipe 123*a*, an MFC 125 and a valve 126. The second gas supply unit may further include a second gas supply source 123 connected to the second gas supply pipe 123*a*. The second gas supply unit may further include a remote plasma unit (RPU) 124 configured to activate the second gas.

<Purge Gas Supply Unit>

The purge gas supply unit includes the purge gas supply pipe 133*a*, an MFC 135 and a valve 136. The purge gas supply unit may further include a purge gas supply source 133 connected to the purge gas supply pipe 133*a*.

<Third Gas Supply Unit>

The third gas supply unit (treatment gas supply unit) includes the third gas supply pipe 143*a*, an MFC 145 and a valve 146. The third gas supply unit may further include a third gas supply source 143 connected to the third gas supply pipe 143*a*. The third gas supply unit may further include a remote plasma unit (RPU) 144 configured to activate the third gas.

<Fourth Gas Supply Unit>

The fourth gas supply unit (additive gas supply unit) includes the fourth gas supply pipe 153*a*, an MFC 155 and a valve 156. The fourth gas supply unit may further include a fourth gas supply source 153 connected to the fourth gas supply pipe 153*a*. The fourth gas supply unit may further include a remote plasma unit (RPU) 154 configured to activate the fourth gas.

<Control Unit>

As shown in FIG. 1, the substrate processing apparatus 100 includes a controller 260 configured to control components the substrate processing apparatus 100.

Figure 3:
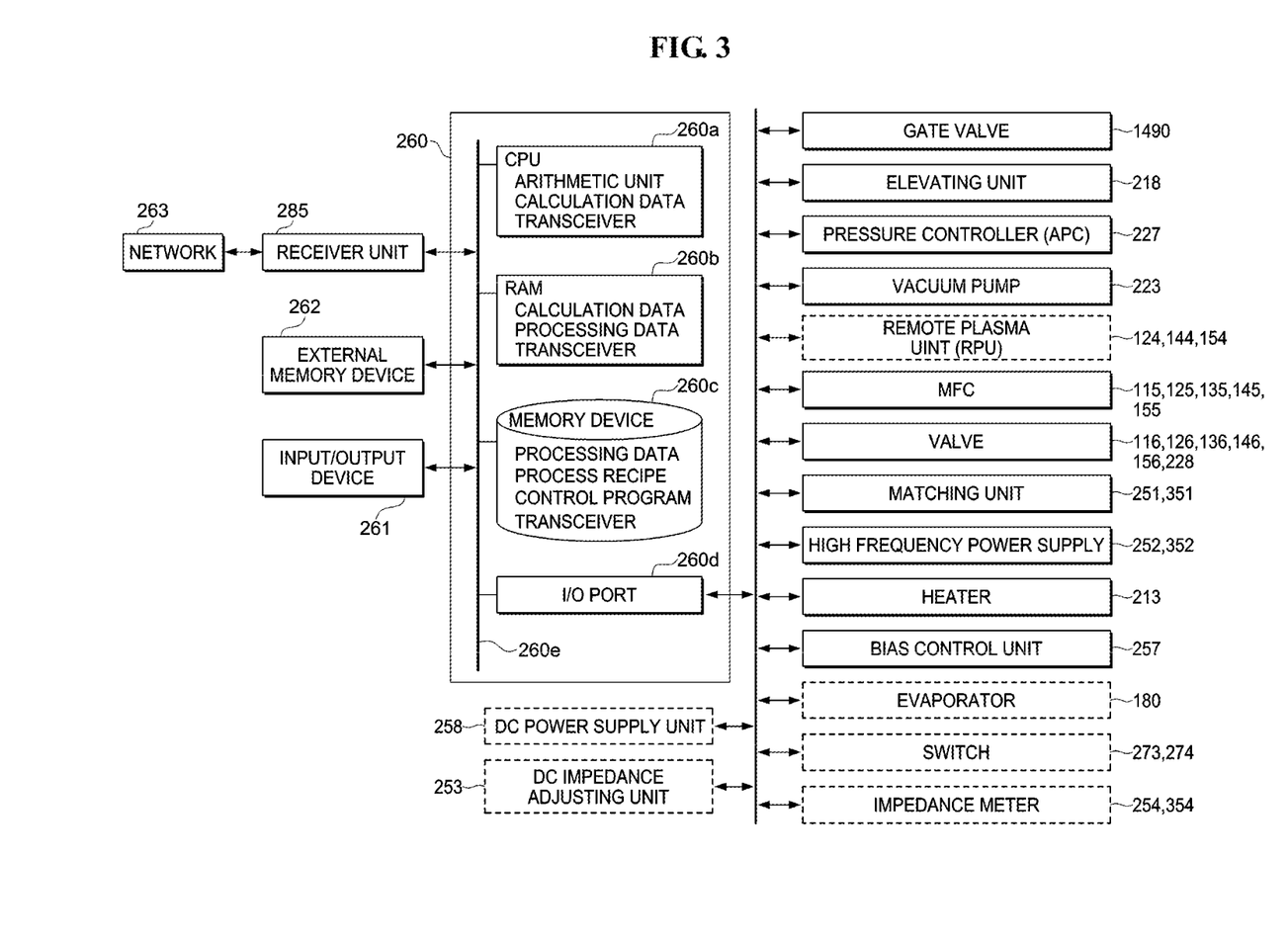
FIG. 3 schematically illustrates a configuration of a controller of the substrate processing apparatus according to the embodiment.

FIG. 3 schematically illustrates the configuration of the controller 260. The controller 260, which is the control unit, may be embodied by a computer having a CPU (Central Processing Unit) 260*a*, a RAM (Random Access Memory) 260*b*, a memory device 260*c* and an I/O port 260*d*. The RAM 260*b*, the memory device 260*c* and the I/O port 260*d* may exchange data with the CPU 260*a* via an internal bus 260*e*. An input/output device 261 such as a touch panel, an external memory device 262 and a receiver unit 285 may be connected to the controller 260.

The memory device 260*c* may be embodied by components such as flash memory and HDD (Hard Disk Drive). A control program for controlling the operation of the substrate processing apparatus; a process recipe in which information such as the order and condition of the substrate processing is stored; and calculation data and processing data generated during the processing of the wafer 200 are readably stored in the memory device 260*c*. The process recipe is a program that is executed in the controller 260 to obtain a predetermined result by performing sequences of the substrate processing. Hereinafter, the process recipe and the control program are collectively referred to simply as a program. The term "program" may refer to only the process recipe, only the control program, or both. The RAM 260*b* is a work area in which data such as the program, the calculation data and the processing data read by the CPU 260*a* are temporarily stored.

The I/O port 260*d* is connected to the gate valve 1490, the elevating unit 218, the heater 213, the pressure controller 227, the vacuum pump 223, the matching units 251 and 351, the high frequency power supplies 252 and 352, the MFCs 115, 125, 135, 145 and 155, the valves 116, 126, 136, 146, 156 and 228, the RPUs 124, 144 and 154, the evaporator 180 and the bias control unit 257. The I/O port 260*d* may be connected to the RPUs 124, 144 and 154 and the evaporator 180. The I/O port 260*d* may be connected to the impedance meters 254 and 354 and the switch 274. The I/O port 260*d* may be connected to a DC power supply unit 258, a DC impedance adjusting unit 253 and switches 273 and 274, which are described later.

The CPU 260*a* serving as the arithmetic unit is configured to read and execute the control program stored in the memory device 260*c*, and read the process recipe in accordance with an instruction such as an operation command inputted from the input/output device 260. The CPU 260*a* may compute the calculation data by comparing a value inputted from the receiver unit 285 with the process recipe or control data stored in the memory device 260*c*. The CPU 260*a* may select the process recipe based on the calculation data. The CPU 260*a* may be configured to perform the opening and closing operations of the gate valve 1490, the operation of the elevating unit 218, the power supply to the heater 213, the operation of the pressure controller 227, the operation of the vacuum pump 223, the operations of the MFCs 115, 125, 135, 145 and 155, the operation of the RPUs 124, 144 and 154, the operations of the valves 116, 126, 136, 146, 156 and 228, the operation of the matching unit 251, the operation of the high frequency power supply 252, the operation of the bias control unit 257, the matching operation of the matching units 251 and 351 based on the data measured by the impedance meters 254 and 354, the power control operations of the high frequency power supplies 252 and 352, the power control operation of the DC power supply unit 258, the impedance adjustment operation of the DC impedance adjusting unit 253, and the ON/OFF operation of the switches 273 and 274 according to the contents of the process recipe. When the CPU 260a controls the operations described above, a transceiver unit (transceiver) in the CPU 260a transmits/receives control information according to the process recipe.

The controller 260 may be embodied by a dedicated computer or a general purpose computer. The controller 260 of the embodiment may be embodied by preparing the external memory device 262 (e.g. magnetic tapes, magnetic disks such as flexible disk and hard disk, optical disks such as CD and DVD, magneto-optical disks such as MO, and semiconductor memories such as USB memory and memory card) and installing the program on the general purpose computer using the external memory device 262. The method of providing the program to the computer is not limited to the external memory device 262. The program may be directly provided to the general purpose computer using a communication means such as a receiver unit 285 or a network 263 (Internet or dedicated line) without the external memory device 262. The memory device 260c or the external memory device 262 may be embodied by a computer-readable recording medium. Hereinafter, the memory device 260c or the external memory device 262 may be collectively referred to as recording medium. Hereinafter, the term "recording medium" may refer to only the memory device 260c, only the external memory device 262, or both.

(2) Substrate Processing

Figure 4:
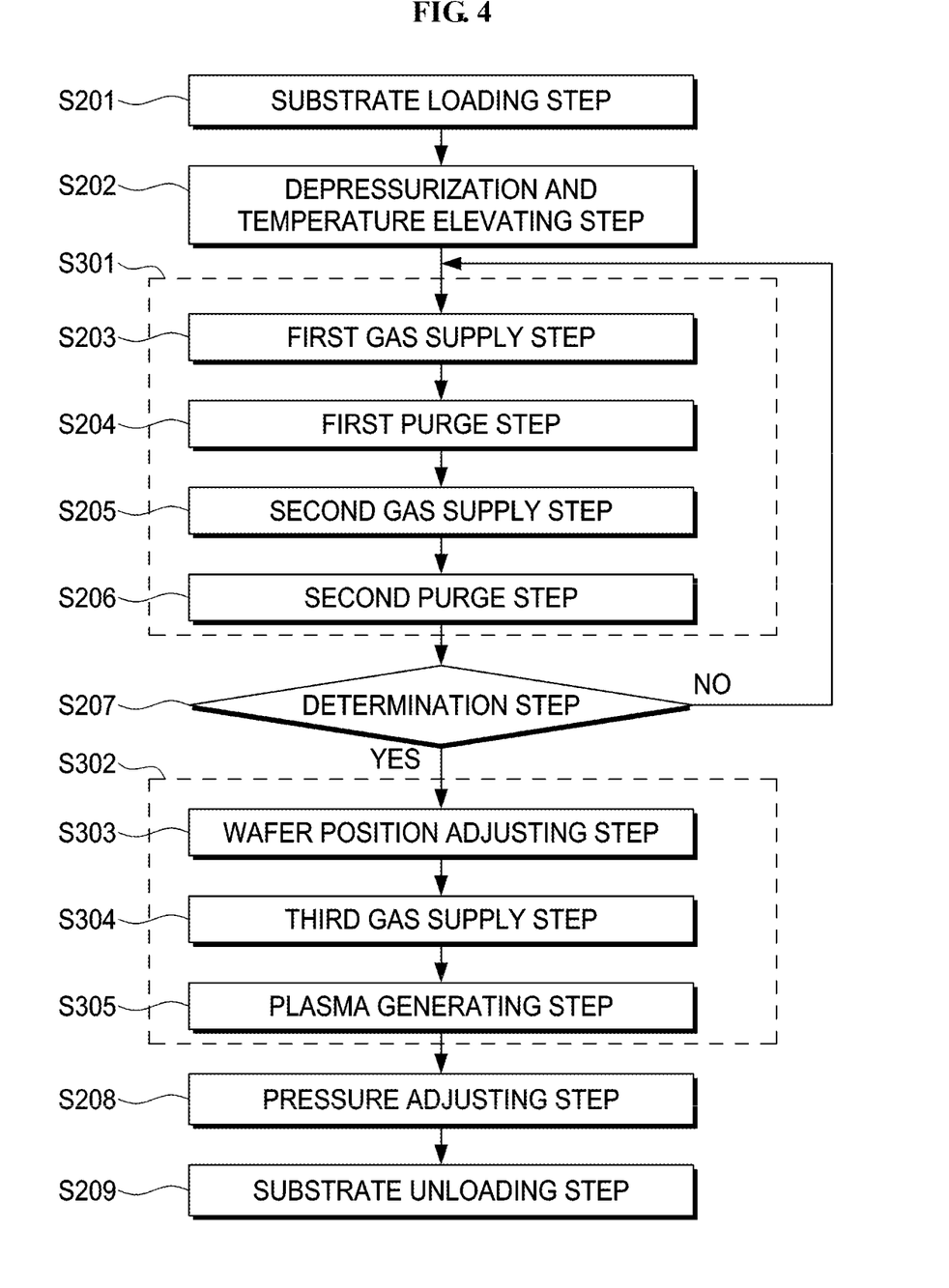
FIG. 4 is a flowchart illustrating a substrate processing according to the embodiment.

Next, a flow for forming a nitride film, a silicon nitride film (SiN film), for example, as an insulating film on a substrate, which is one of semiconductor device manufacturing processes, using the above-described substrate processing apparatus is described with reference to FIGS. 4 and 5. In the following description, the operations the components constituting the substrate processing apparatus are controlled by the controller 260.

Hereinafter, the term "wafer" refers to "wafer itself" or "stacked structure of wafer and layer or film formed on the surface thereof" (collectively to "the wafer and the layer or the film formed on the surface thereof"). "Surface of wafer" may be refers to "surface of wafer itself" or "surface of layer or film formed on the surface of wafer" (i.e. "top surface of the stacked structure").

Thus, in the specification, "supplying a predetermined gas to a wafer" refers to "directly supplying a predetermined gas to a surface (exposed surface) of the wafer itself" or "supplying a predetermined gas to a layer or film formed on a wafer" (i.e. "supplying a predetermined gas to the top surface of the stacked structure"). In the specification, "forming a predetermined layer (or film) on a wafer" refers to "forming a predetermined layer (or film) directly on the surface (exposed surface) of the wafer itself" or "forming a predetermined layer (or film) on the stacked structure" ((i.e. "forming a predetermined layer (or film) on the top surface of the stacked structure").

The term "substrate" is used in the same sense as "wafer" in the specification, and the term "wafer" may be replaced by "substrate."

Hereinafter, the substrate processing will be described.

<Substrate Loading Step S201>

In a film-forming process, the wafer 200 is loaded into the first process chamber 201a. Specifically, the substrate support unit 210 is lowered by the elevating unit 218, the lift pins 207 protrude from the upper surface of the substrate support unit 210 through the holes 214. After the inner pressure of the first process chamber 201a and the second process chamber 201b or the inner pressure of the transfer chamber 203 is adjusted to a predetermined pressure, the gate valve 1490 is opened. The wafer 200 is transferred through the gate valve 1490 and placed on the lift pins 207. After the wafer 200 is placed on lift pins 207, the gate valve 1490 is closed. By elevating the substrate support unit 210 to a predetermined position by the elevating unit 218, the wafer 200 is transferred from the lift pins 207 to the substrate support unit 210.

<Depressurization and Temperature Elevating Step S202>

Next, the first process chamber 201a is exhausted through the exhaust pipe 224 until the inner pressure of the first process chamber 201a reaches a predetermined level (vacuum level). At this time, the opening degree of the pressure controller 227, which is an APC valve, is feedback-controlled based on the pressure measured by the pressure sensor (not shown). The amount of current applied to the heater 213 is feedback-controlled based on the temperature value detected by the temperature sensor (not shown) until the inner temperature of the first process chamber 201a reaches a predetermined temperature. Specifically, the substrate support unit 210 is pre-heated by the heater 213 until the temperature of the wafer 200 or the temperature of the substrate support unit 210 is stable. When gas from members or moisture is present in the first process chamber 201a, the gas or the moisture may be removed by vacuum-exhaust or purged with $N_2$ gas. The pre-processing step before the film-forming process is now complete. It is preferable that the first process chamber 201a is exhausted to a vacuum level as much as possible until the inner pressure thereof reaches the predetermined pressure.

In this case, the temperature of the heater 213 ranges from 100° C. to 600° C., preferably from 100° C. to 500° C., more preferably from 250° C. to 450° C.

The bias control unit 257 and the bias electrode 256 may adjust the electric potential of the wafer 200 such that the electric potential of the wafer 200 is at a predetermined level.

<Film-Forming Step S301>

Hereinafter, an example of forming an SiN film on the wafer 200 will be described. The film-forming step S301, which is a first process, will be described in detail with reference to FIG. 4 and FIG. 5.

When the wafer 200 is placed on the substrate support unit 210, and the inner atmosphere of first process chamber 201a is stabilized, steps S203 through S207 described below are performed.

<First Gas Supply Step S203>

In the first gas supply step S203, a dichlorosilane ($SiH_2Cl_2$: DCS gas), which is the first gas (process gas), is supplied into the first process chamber 201a by the first gas supply system. Specifically, the DCS gas is supplied from the first gas supply source 113. The DCS gas having the flow rate thereof adjusted by the MFC 115 is supplied to the substrate processing apparatus 100. The DCS gas having the flow rate thereof adjusted is then supplied to the depressurized first process chamber 201a through the buffer chamber 232 and the holes 234a of the shower head 234. The exhaust system continuously exhausts the first process chamber 201a such that the inner pressure of the first process chamber 201a is maintained at a predetermined pressure. At this time, the DCS gas is supplied to the wafer 200 in the first process chamber 201a at a predetermined pressure (first pressure) ranging from 10 Pa to 1000 Pa for example. By supplying the DCS gas to the wafer 200, a silicon-containing layer is formed on the wafer 200. In the embodiment, the silicon-containing layer refers to a layer including silicon (Si) or a layer including silicon and chlorine (Cl).

<First Purge Step S204>

After the silicon-containing layer is formed on the wafer 200, the gas valve 116 at the first gas supply pipe 113a is closed to stop the supply of the DCS gas. The first purge step S204 is performed by stopping the supply of the DCS gas and exhausting the first gas present in the first process chamber 201a or the process gas present in the buffer chamber 232 by the first exhaust unit.

In the first purge step S204, the remaining gas may be extruded by further supplying an inert gas from the purge gas supply source 133 in addition to exhausting the gas by the vacuum exhaust. In this case, the valve 136 is opened and the flow rate of the inert gas is adjusted by the MFC 135. The vacuum exhaust may be combined with the supply of the inert gas. In the alternative, the vacuum exhaust and the supply of the inert gas may alternatively be performed.

After a predetermined time elapses, the supply of the inert gas is stopped by closing the valve 136. However, the inert gas may be continuously supplied by maintaining the valve 136 open.

The temperature of the heater 213 may be equal to that of the heater 213 when the first gas supplied to the wafer 200. Preferably, the flow rate of $N_2$ gas, which is a purge gas supplied by the inert gas supply system, may range from 100 sccm to 20000 sccm. Rare gases such as argon (Ar), helium (He), neon (Ne) and xenon (Xe) may be used as the purge gas as well as $N_2$ gas.

<Second Gas Supply Step S205>

After first purge step S204, the valve 126 is opened to supply ammonia ($NH_3$) gas, which is the second gas (process gas), into the first process chamber 201a via the gas introduction port 241, the buffer chamber 232 and the holes 234a. The second gas is also referred to as process gas for processing the wafer 200, or a reactive gas which reacts with the first gas, the silicon-containing layer and the wafer 200.

At this time, the MFC 125 adjusts the flow rate of the $NH_3$ gas to a predetermined value. For example, the flow rate of $NH_3$ gas may range from 100 sccm to 10000 sccm.

The high frequency power is supplied from the high frequency power supply 252 to the first electrode 244 via the matching unit 251. By supplying the high frequency power to the first electrode 244, a plasma of the second gas (active species of the second gas) is generated in the holes 234a or in the first process chamber 201a. When the activated $NH_3$ is supplied to the silicon-containing layer formed on the wafer 200, the silicon-containing layer is modified to a layer containing silicon and nitrogen.

Figure 5:
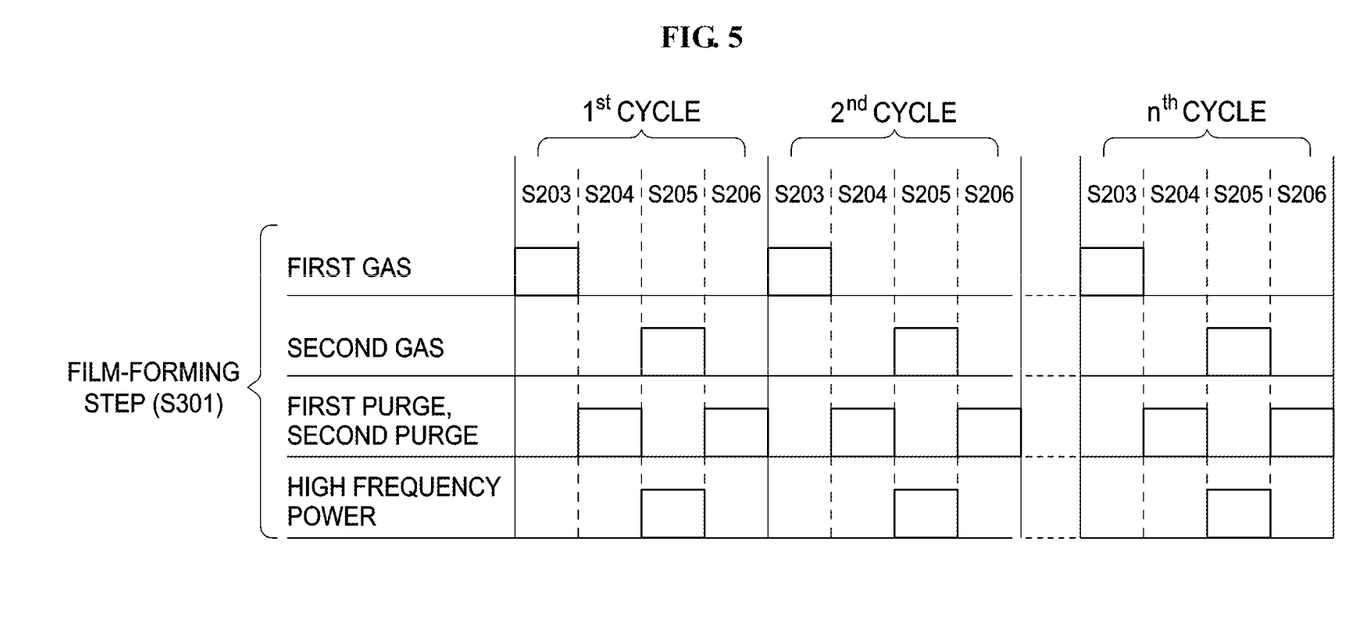
FIG. 5 exemplifies a sequence of the substrate processing according to the embodiment.

While FIG. 5 illustrates an example wherein the high frequency power is applied simultaneously with the supply of the second gas, the high frequency power may be supplied before supply of the second gas. The high frequency power may also be continuously applied from the start of the first gas supply step S203 to the end of a determination step S207 such that a plasma of the second gas is formed only when the second gas is supplied.

The bias control unit 257 may adjust the electric potential of bias electrode 256 provided in the substrate support 212 to control the amount of charge particles supplied to the wafer 200.

A modified layer having a predetermined thickness, a predetermined distribution, a predetermined intrusion depth of nitrogen component is formed depending on the conditions such as the inner pressure of the first process chamber 201a, the flow rate of the $NH_3$ gas, the temperature of the wafer 200 and the electric power of the high frequency power supply 252.

After a predetermined time elapses, the valve 126 is closed to stop the supply of $NH_3$ gas.

At this time, the temperature of the heater 213 may be equal to that of the heater 213 when the first gas supplied to the wafer 200.

The processing uniformity may be improved by supplying the $NH_3$ gas activated by the RPU 124 to the buffer chamber 232.

<Second Purge Step S206>

The second purge step S206 same as the first purge step S204 is performed. For example, the supply of $NH_3$ gas is stopped and the $NH_3$ gas present in the first process chamber 201a or the $NH_3$ gas present in the buffer chamber 232 is exhausted by the first exhaust unit. Purge is performed by supplying a purge gas into the buffer chamber 232 and the first process chamber 201a.

<Determination Step S207>

After the second purge step S206 is complete, the controller 260 determines whether the cycle (the film-forming step S301) including the step S203 through the step S206 is performed a predetermined number of times (n times). That is, the controller 260 determines whether a film having a desired thickness is formed on the wafer 200. The film (SiN film) having the desired thickness may be formed by performing the cycle including the step S203 through the step S206 at least once. It is preferable that the cycle is performed multiple times until the SiN film having the desired thickness is formed on the wafer 200.

When the controller 260 determines, in the determination step S207, that the cycle is not performed the predetermined number of times ("NO" in FIG. 4), the film-forming step S301 is repeated. When the controller 260 determines, in the determination step S207, that the cycle is performed the predetermined number of times ("YES" in FIG. 4), the film-forming step S301 is terminated and a second process step S302 is then performed.

<Second Process (Treatment Process) Step S302>

Hereinafter, an example of modifying the SiN film on the wafer 200 as a second process (also referred to as treatment process) will be described. The second process step S302 will be described in detail with reference to FIG. 4.

<Wafer Position Adjusting Step S303>

In the second process step S301, first, the wafer 200 is lowered until the second process position 201c denoted by the dashed line in FIG. 1 is reached. Specifically, the substrate support unit 210 is lowered by the elevating unit 218 such that the wafer 200 is in the second process chamber 201b which is below the first process chamber 201a and spatially in communication with the first process chamber 201a. The inner pressure of the second process chamber 201b is also adjusted to a predetermined pressure by blocking the exhaust through the first exhaust port 221 and by exhausting through the second exhaust port 1481. The temperature of the heater 213 and the potential of the bias electrode 256 may be adjusted. After the inner pressure of the second process chamber 201*b* is adjusted, a third gas supply step S304 is performed.

<Third Gas Supply Step S304>

In the third gas supply step S304, ammonia gas (NH$_3$), which is the third gas (treatment gas), is supplied into the second process chamber 201*b* through the third gas supply system. Specifically, the NH$_3$ gas is supplied from the third gas supply source 143. The NH$_3$ gas having the flow rate thereof adjusted by the MFC 145 is supplied to the substrate processing apparatus 100. The NH$_3$ gas having the flow rate thereof adjusted is then supplied to the second process chamber 201*b* through the buffer chamber 232, the holes 234*a* of the shower head 234, and the depressurized first process chamber 201*a*. The exhaust system continuously exhausts the inner atmosphere of the second process chamber 201*b* through the second exhaust port 1481 such that the inner pressure of the second process chamber 201*b* is maintained at a predetermined pressure. At this time, the NH$_3$ gas is supplied to the wafer 200 in the second process chamber 201*b* at a predetermined pressure (second pressure) ranging from 10 Pa to 1000 Pa for example.

<Plasma Generating Step S305>

In the plasma generating step S305, the switch 274 is switched so that power is supplied from the high frequency power supply 252 to the second electrode 344. By switching the switch 274, the high frequency power is supplied to the second electrode 344 provided in the quartz member 345. By supplying the high frequency power to the second electrode 344, a plasma of the third gas (active species of the third gas) is generated in the second process chamber 201*b* (between the second electrode 344). The treatment process is performed by supplying the activated NH$_3$ to the SiN film formed on the wafer 200, Specifically, hydrogen component in the activated NH$_3$ removes chlorine (Cl) component remaining in the SiN film, and nitrogen component in the activated NH$_3$ permeates the site where the chlorine component is removed as well as other sites, thereby, improving (modifying) the characteristics of the SiN film. After the wafer 200 is processed using the plasma for a predetermined time, the power supply to the second electrode 344 and the supply of the third gas are stopped, and the inner atmosphere of the second process chamber 201*b* is exhausted. When the inner atmosphere of the second process chamber 201*b* is exhausted, a purge process, which is the same as the first purge step S204, may be performed. In the plasma generating step S305, the exhaust system continuously exhausts the inner atmosphere of the second process chamber 201*b* through the first exhaust port 221 and the second exhaust port 1481. By exhausting the inner atmosphere of the second process chamber 201*b* through the first exhaust port 221 and the second exhaust port 1481, the time necessary for exhausting the inner atmosphere of the second process chamber 201*b* may be shortened.

<Pressure Adjusting Step S208>

After the plasma generating step S305 is completed, the second process chamber 201*b* or the transfer chamber 203 is exhausted through the second exhaust port 1481 until the inner pressure of the second process chamber 201*b* or the inner pressure of the transfer chamber 203 reaches a predetermined level (vacuum level) in the pressure adjusting step S208. Before, during or after the pressure adjusting step S208, the wafer 200 may be supported by the lift pins 207 until the wafer 200 is cooled down to a predetermined temperature. In the pressure adjusting step S208, the exhaust system continuously exhausts the inner atmosphere of the second process chamber 201*b* or the inner atmosphere of the transfer chamber 203 through the first exhaust port 221 and the second exhaust port 1481. By exhausting the inner atmosphere of the second process chamber 201*b* through the first exhaust port 221 and the second exhaust port 1481, the time necessary for exhausting the inner atmosphere of the second process chamber 201*b* may be shortened.

<Substrate Unloading Step S209>

After the inner pressure of the second process chamber 201*b* is adjusted to a predetermined pressure in the pressure adjusting step S208, the gate valve 1490 is opened. Then, the wafer 200 is unloaded from the transfer chamber 203 to a vacuum transfer chamber (not shown).

Although the above embodiment is described by way of an example wherein DCS and NH$_3$ are used as the first gas and the second gas, respectively, in the first process to form the SiN film, and NH$_3$ is used as the third gas in the second process, the technique is not limited thereto. The above-described technique may be applied, for example, to formations of TiN film, SiO film and HfO film. That is, the above-described technique may also be applied to the formation of the TiN film using TiCl$_4$, NH$_3$ and NH$_3$ as the first gas, the second gas and the third gas, respectively. The above-described technique may also be applied to the formation of the SiO$_2$ film using SiH$_4$, O$_2$ and O$_2$ as the first gas, the second gas and the third gas, respectively. The above-described technique may also be applied to the formation of the HfO film using HfCl$_4$ or TEMAH, O$_2$ and O$_2$ as the first gas, the second gas and the third gas, respectively.

As described above, the second gas and the third gas may be the same. Although the above-described embodiment is described by way of an example wherein the second gas and the third gas are supplied using different gas supply units, the above-described technique is not limited thereto. The above-described technique may also be applied when the second gas and the third gas are supplied using the same gas supply unit.

The second gas may differ from the third gas. For example, NH$_3$ gas may be used as the second gas, and H$_2$ gas, which is a hydrogen-containing gas, may be used as the third gas.

When the treatment process is performed, the fourth gas may be supplied in addition to the third gas. For example, an oxygen-containing gas such as O$_2$ gas and a hydrogen-containing gas such as H$_2$ gas may be used as the third gas and the fourth gas, respectively such that an element constituting the film is supplied while removing impurities such as chlorine (Cl), carbon (C) and oxygen (O) present in the film. For example, oxygen (O) may be supplied while removing chlorine (Cl). NH$_3$ gas and H$_2$ gas may also be used as the third gas and the fourth gas, respectively.

Preferably, the density of the active species generated during the first process is less than that of the active species generated during the second process. That is, the density of the active species generated in the second process is higher than that of the active species generated in the first process. Since the first process is a cyclic process, it is preferable that the volume of the first process chamber 201*a* is small.

The first exhaust port 221 is used for exhausting the gas during the first process (film-forming process), and the second exhaust port 1481 is used for exhausting the gas during the second process (treatment process).

The first process chamber 201*a* is used in the first process (film-forming process), the second process chamber 201*b*, which is provided under the first process chamber 201*a*, is used in the second process.

During the second process, the upper surface of the wafer 200 is lower than the second electrode 344 and the side surface of the wafer 200 faces the quartz member 345 of the second electrode 344. When the upper surface of the wafer 200 is lower than the second electrode 344, the amount of ion components in the active species generated by the second electrode 344 that reaches the wafer 200 may be reduced. The gas exhaust channel 355 is provided between the substrate support 212 and the quartz member 345 when the side surface of the wafer 200 faces the quartz member 345 of the second electrode 344 such that the treatment gas may be discharged through the periphery of the substrate support 212, thereby improving the uniformity of the treatment process.

While the technique is described by way of exemplary embodiments, the above-described technique is not limited thereto. Hereinafter, other embodiments will be described with reference to FIG. 6.

Other Embodiments

Figure 6:
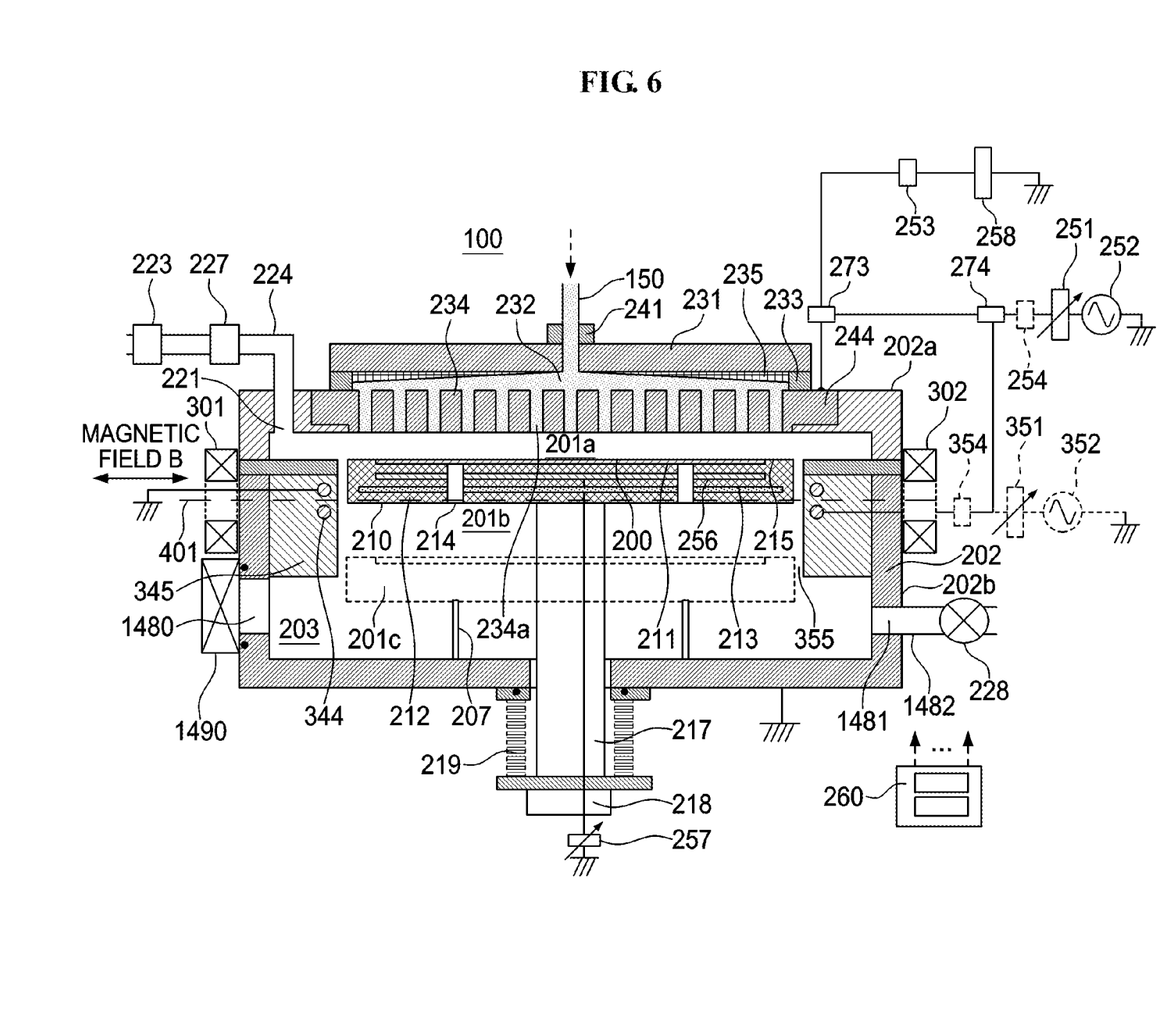
FIG. 6 schematically illustrates a configuration of a substrate processing apparatus according to other embodiments.

The partition plate 204, the upper vessel 202a and the lower vessel 202b are made of quartz. A rectangular first coil 301 and a rectangular second coils 302, which are magnetic field generating units, are provided outside the processing vessel 202 so as to generate a horizontal magnetic field B parallel to the wafer 200.

By generating the horizontal magnetic field B parallel to the wafer 200, ions or electrons in the plasma generated by the second electrode 344 may be captured by the magnetic field B to reduce the amount of ions or electrons reaching the wafer 200, thereby improving the step coverage during the processing of the wafer 200. Since the amount of ions reaching the wafer 200 is reduced, the damage to the film formed on the wafer 200 may also be reduced.

Preferably, the center of the first coil 301, the center of the second coil 302 and the center of the second activation unit (second electrode 344) are on a dashed line 401 shown in FIG. 6 to increase the amount of the ion component or the electron component in the active species captured by the magnetic field B generated by the first coil 301 and the second coil 302. As a result, the amount of the ion component or the electron component reaching the wafer 200 may be reduced to suppress the damage to the film formed on the wafer 200.

A DC voltage from the DC power supply unit 258 may be applied to the first electrode 244 via the DC impedance adjusting unit 253 and the switch 273 such that a high frequency power and the DC voltage may be applied to the first electrode 244 during the first process (film-forming process) and the second process (treatment process), respectively. Preferably, during the treatment process, by applying the DC voltage to the first electrode 244 to make the electric potential of the first electrode 244 negative, the ion component in the plasma generated by the second electrode 344 is drawn near to the first electrode 244. As a result, the amount of ions reaching the wafer 200 may be reduced, thereby improving the step coverage during the processing of the wafer 200. Since the amount of ions reaching the wafer 200 is reduced, the damage to the film formed on the wafer 200 may be suppressed.

While the embodiment is described by way of an example wherein the high frequency power supply 252 supplies power to the first electrode 244 and the second electrode 344, the above-described technique is not limited thereto. The above-described technique may be applied when a second matching unit 351 and a second high frequency power supply 352 are provided for the second electrode 344 and high frequency power of different frequencies or magnitudes is applied to the first electrode 244 and the second electrode 344.

While an embodiment wherein the first gas and the second gas are alternately supplied to form a film is exemplified above, the above-described technique may be applied to other methods. For example, the above-described technique may be applied even when the supply of the first gas and the supply of the second gas partially overlap.

While an embodiment wherein two different gases are supplied to process the wafer, the above-described technique may also be applied to wafer processing wherein one type of gas is supplied.

While a film-forming process is exemplified above, the above-described technique may be applied to other processes. For example, the above-described technique may also be applied to diffusion process, oxidation process, nitridation process, oxynitridation process, reduction process, oxidation-reduction process, etching process and heating process using plasma. The above-described technique may also be applied to plasma oxidation or plasma nitridation of a film formed on a substrate using only a reactive gas. The above-described technique may also be applied to the plasma annealing process using only the reaction gas. After performing the above-described processes as the above-described first process, the above-described second process step may be performed.

While the manufacturing process of a semiconductor device is exemplified above, the above-described techniques may be applied to other manufacturing processes. For example, the above-described techniques may be applied to a manufacturing process of a liquid crystal device, a manufacturing process of a solar cell, a manufacturing process of a light emitting device, a manufacturing process of a glass substrate, a manufacturing process of a ceramic substrate and a manufacturing process of a conductive substrate.

While an embodiment wherein a silicon nitride film is formed using a silicon-containing gas as the source gas and a nitrogen-containing gas as the reactive gas, the above-described techniques may be applied to methods for forming other films using different gases. For example, the above-described technique may also be applied to a formation of an oxygen-containing film, a formation of a nitrogen-containing film, a formation of a carbon-containing film, a formation of a boron-containing film and a formation of a metal-containing film and a formation of a film containing at least two of these elements. The above-described technique may also be applied to a formation of AlO film, ZrO film, HfO film, HfAlO film, ZrAlO film, SiC film, SiCN film, SiBN film, TiN film, TiC film and TiAlC film.

While a substrate processing apparatus capable of that processing one substrate in one process chamber is exemplified above, the above-described techniques are not limited thereto and may be applied to other substrate processing apparatuses. For example, the above-described technique may also be applied to a substrate processing apparatus capable of processing a plurality of substrates arranged horizontally or vertically.

According to above-described technique, a large amount of active species may be generated during the processes using plasma for modifying the characteristics of the film.

What is claimed is:

1. A substrate processing apparatus comprising:
   a first process chamber;
   a second process chamber spatially in communication with the first process chamber;

a substrate support unit configured to support a substrate;

a first electrode provided in the first process chamber to face the substrate support unit;

a second electrode provided at a tide wall of the second process chamber, wherein the second electrode comprises a coil inserted in a quartz member to surround the second process chamber;

an elevating unit configured to move the substrate support unit between the first process chamber and the second process chamber;

a gas supply unit configured to supply a first gas, a second gas and a third gas to the substrate;

a power supply unit configured to apply electric power to the first electrode and the second electrode;

a first exhaust unit provided in the first process chamber and configured to exhaust an atmosphere on the substrate support unit;

a second exhaust unit provided in the second process chamber to be located below the substrate support unit and configured to exhaust the atmosphere above the substrate support unit a gas exhaust path; and a control unit configured to control the elevating unit, the gas supply unit, the power supply unit, the first exhaust unit and the second exhaust unit, and the control unit configured to perform:

(a) after the substrate is transferred into the first process chamber, exhausting an inner atmosphere of the first process chamber via the first exhaust unit while supplying, to the substrate, at least one selected from the group consisting of the first gas, the second gas and the third gas activated by the first electrode;

(b) after performing (a), forming the gas exhaust path in the second process chamber and between the substrate support unit and the quartz member, wherein a side surface of the substrate faces the quartz member by vertically transferring the substrate support unit from the first process chamber to the second process chamber by the elevating unit; and (c) after performing (b), exhausting the inner atmosphere of the first process chamber and an inner atmosphere of the second process chamber via the second exhaust unit along the gas exhaust path while supplying, to the substrate, at least one selected from the group consisting of the first gas, the second gas and the third gas activated by the second electrode.

2. The substrate processing apparatus of claim 1, wherein the control unit is configured to control the elevating unit, the gas supply unit and the power supply unit so as to: (d) perform a first process in the first process chamber, wherein the first process at least comprises supplying the second gas activated by the first electrode and the first gas to the substrate; (e) move the substrate placed on the substrate support unit from the first process chamber to the second process chamber; and (f) perform a second process in the second process chamber, wherein the second process at least comprises supplying the third gas activated by the second electrode to the substrate.

3. The substrate processing apparatus of claim 2, wherein the first electrode is configured to generate a capacitively coupled plasma, and the second electrode is configured to generate an inductively coupled plasma.

4. The substrate processing apparatus of claim 2, wherein the control unit is further configured to control the elevating unit to move the substrate placed on the substrate support unit before (f) such that an upper surface of the substrate is lower than a lower end of the coil and the side surface of the substrate faces the quartz member.

5. The substrate processing apparatus of claim 2, further comprising: a magnetic field generating unit provided at one side of the second electrode, wherein the control unit is further configured to control the magnetic field generating unit to generate a horizontal magnetic field parallel to the substrate before (f).

6. The substrate processing apparatus of claim 2, wherein the power supply unit is configured to supply a DC voltage to the first electrode, and the control unit is further configured to control the power supply unit to apply a negative voltage to the first electrode before (f).

7. The substrate processing apparatus of claim 2, wherein the control unit is further configured to control the power supply unit and the gas supply unit such that a density of active species generated during the second process is higher than that of active species generated during the first process.

8. The substrate processing apparatus of claim 2, wherein the control unit is further configured to control the elevating unit, the gas supply unit and the power supply unit such that (e) is performed after performing (d) and (f) is performed after performing (e).

9. The substrate processing apparatus of claim 3, wherein the control unit is further configured to control the elevating unit to move the substrate placed on the substrate support unit before (f) such that an upper surface of the substrate is lower than a lower end of the coil and the side surface of the substrate faces the quartz member.

10. The substrate processing apparatus of claim 3, further comprising: a magnetic field generating unit provided at one side of the second electrode, wherein the control unit is further configured to control the magnetic field generating unit to generate a horizontal magnetic field parallel to the substrate before (f).

11. The substrate processing apparatus of claim 3, wherein the power supply unit is configured to supply a DC voltage to the first electrode, and the control unit is further configured to control the power supply unit to apply a negative voltage to the first electrode before (f).

12. The substrate processing apparatus of claim 3, wherein the control unit is further configured to control the power supply unit and the gas supply unit such that a density of active species generated during the second process is higher than that of active species generated during the first process.

13. The substrate processing apparatus of claim 4, wherein the power supply unit is configured to supply a DC voltage to the first electrode, and the control unit is further configured to control the power supply unit to apply a negative voltage to the first electrode before (f).

14. The substrate processing apparatus of claim 5, wherein the power supply unit is configured to supply a DC voltage to the first electrode, and the control unit is further configured to control the power supply unit to apply a negative voltage to the first electrode before (f).

15. The substrate processing apparatus of claim 9, further comprising: a magnetic field generating unit provided at one side of the second electrode, wherein the control unit is further configured to control the magnetic field generating unit to generate a horizontal magnetic field parallel to the substrate before (f).

16. The substrate processing apparatus of claim 4, wherein the power supply unit is configured to supply a DC voltage to the first electrode, and the control unit is further configured to control the power supply unit to apply a negative voltage to the first electrode before (f).

17. The substrate processing apparatus of claim 9, wherein the control unit is further configured to control the power supply unit and the gas supply unit such that a density of active species generated during the second process is higher than that of active species generated during the first process.

18. The substrate processing apparatus of claim 15, wherein the control unit is further configured to control the power supply unit and the gas supply unit such that a density of active species generated during the second process is higher than that of active species generated during the first process.

* * * * *